(12) United States Patent
Li (10) Patent No.: US 10,510,538 B2
(45) Date of Patent: Dec. 17, 2019

(54) REDUCING EUV-INDUCED MATERIAL PROPERTY CHANGES

(71) Applicant: Taiwan Semiconductor Manufacturing Company, Ltd., Hsinchu (TW)

(72) Inventor: Chia-Ying Li, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/499,715

(22) Filed: Apr. 27, 2017

(65) Prior Publication Data

US 2018/0151350 A1     May 31, 2018

Related U.S. Application Data

(60) Provisional application No. 62/427,505, filed on Nov. 29, 2016.

(51) Int. Cl.
| | | |
|---|---|---|
| *H01L 21/027* | (2006.01) | |
| *C23C 14/48* | (2006.01) | |
| *C23C 16/455* | (2006.01) | |
| *C23C 16/48* | (2006.01) | |
| *C23C 16/50* | (2006.01) | |
| *H01L 21/02* | (2006.01) | |

(52) U.S. Cl.
CPC ......... *H01L 21/0274* (2013.01); *C23C 14/48* (2013.01); *C23C 16/45525* (2013.01); *C23C 16/483* (2013.01); *C23C 16/50* (2013.01); *H01L 21/0228* (2013.01); *H01L 21/02274* (2013.01); *H01L 21/02296* (2013.01)

(58) Field of Classification Search
None
See application file for complete search history.

(56) References Cited

U.S. PATENT DOCUMENTS

| | | | | |
|---|---|---|---|---|
| 6,144,060 | A * | 11/2000 | Park | H01L 28/75 |
| | | | | 257/298 |
| 2016/0126088 | A1 * | 5/2016 | Kim | G03F 7/40 |
| | | | | 257/618 |
| 2017/0263496 | A1 * | 9/2017 | Hourani | H01L 21/76816 |
| 2017/0301542 | A1 * | 10/2017 | Maes | G03F 7/0002 |

\* cited by examiner

*Primary Examiner* — Bradley Smith
(74) *Attorney, Agent, or Firm* — Slater Matsil, LLP (57) ABSTRACT

Representative systems and methods for preventing or otherwise reducing extreme-ultraviolet-induced material property changes (e.g., layer thickness shrinkage) include one or more thermal treatments to at least partially stabilize a material forming a material layer disposed over a substrate prior to extreme ultraviolet (EUV) exposure (e.g., wavelengths spanning about 124 nm to about 10 nm) attendant to photolithographic processing. Representative systems and methods provide for reduction of average compressive stress in a material layer after thermal treatment prior to extreme EUV photolithographic patterning. Representative thermal treatments may include one or more annealing processes, ultraviolet (UV) radiation treatments, ion implantations, ion bombardments, plasma treatments, surface baking treatments, surface coating treatments, surface ashing treatments, or pulsed laser treatments.

20 Claims, 9 Drawing Sheets

REDUCING EUV-INDUCED MATERIAL PROPERTY CHANGES

PRIORITY CLAIM

This application claims the benefit to U.S. Provisional Patent Application No. 62/427,505 filed Nov. 29, 2016, and entitled "Reducing EUV-Induced Material Property Changes," which application is incorporated herein by reference.

BACKGROUND

With increasing down-scaling of semiconductor devices, various processing techniques, such as photolithography, have been adapted to allow for the manufacture of devices with increasingly smaller dimensions; however, as semiconductor processes require smaller process windows, the manufacture of these devices have approached and even surpassed theoretical limits of conventional photolithography techniques. As semiconductor devices continue to shrink, the desired spacing between elements of a device may be less than the pitch that can be manufactured using traditional optical masks and lithography techniques.

Next generation lithography (NGL) is expected to replace current optical lithography methods. There are several NGL candidates, such as extreme ultraviolet (EUV) lithography (EUVL), electron projection lithography (EPL), ion projection lithography (IPL), nanoimprint, and X-ray lithography. Of these, EUVL is an attractive candidate—having most of the properties of optical lithography.

BRIEF DESCRIPTION OF THE DRAWINGS

For a more complete understanding of representative embodiments, and advantages thereof, reference is now made to the following descriptions taken in conjunction with the accompanying drawings, in which.

DETAILED DESCRIPTION

Reference will now be made to detailed embodiments illustrated in the accompanying drawings. Wherever possible, same reference numbers are used in the drawings and the description to refer to the same or similar parts. Relative sizes, shapes and dimensions may be exaggerated for clarity and convenience of illustration. The description is directed to elements forming part of, or cooperating more directly with, methods, systems, and apparatuses in accordance with the present disclosure. It will be understood that elements not specifically shown or described may take various forms known to those skilled in the art. Many alternatives and modifications may be apparent to those skilled in the art, once informed by the present disclosure.

Reference throughout this specification to "one embodiment" or "an embodiment" means that a particular feature, structure, or characteristic described in connection with an embodiment is included in at least one embodiment. Accordingly, appearance of the phrases "in one embodiment" or "in an embodiment" in various places throughout the specification are not necessarily referring to a same embodiment. Furthermore, particular features, structures or characteristics may be combined in any suitable manner in one or more embodiments. It should be appreciated that the Figures are not drawn to scale; rather, the Figures are merely intended for representative illustration.

Spatially relative terms, such as "beneath," "below," "lower," "under," "above," "upper," "over," "adjacent," "interposing," and contextual variants thereof, may be used herein for ease of description to describe an element or feature in relationship to other elements or features representatively illustrated in the Figures. Spatially relative terms are intended to encompass different orientations of a device in use or operation, in addition to orientations representatively illustrated in the Figures. Devices or structures may be otherwise oriented (e.g., rotated 90 degrees, or at other orientations) with spatially relative descriptors used herein being interpreted accordingly.

Optical lithography processes are used to form device features of integrated circuits on wafers. A typical optical lithography process involves applying a photoresist and defining patterns in the photoresist. Transparent or opaque portions of the lithography mask define the pattern in the photoresist. The patterns in the photoresist may then be transferred to underlying features with etching, where the patterned photoresist is used as an etching mask. After etching, the patterned photoresist is removed.

With increasing down-scaling of integrated circuit devices, optical proximity effects pose a greater challenge for transferring patterns from a photolithography mask to a wafer. When two discrete features are closely spaced on the order of the wavelength of electromagnetic radiation used for pattern imaging, optical proximity effects may cause adjacent features to short between one another. Double-patterning technology has been introduced for enhancing feature definition to address such challenges. Two-pattern-two-etch (2P2E) is one such technology.

In 2P2E processing, closely-spaced features are separated into two (or more) lithography masks, with separate lithography masks being used to expose the same photoresist or different photoresists such that patterns for closely-spaced features may be subsequently transferred to a same layer. In each of the multi-patterning lithography masks, distances between features are increased over the distances between the features in the otherwise single-pattern mask so as to be suitably larger than the wavelength of electromagnetic radiation used to expose the pattern. In the case of using two lithography masks, the resolution of composite imaging is effectively doubled. Consequently, distances in multi-patterning lithography masks are typically greater than the threshold distances for the onset of optical proximity effects, and hence, substantially reduce challenges associated with such effects.

Embodiments disclosed herein generally relate to the field of fabricating semiconductor devices with closely-spaced device elements, and more particularly, to methods of stabilizing material of a semiconductor device layer (e.g., a dielectric layer) prior to imaging/patterning with extreme ultraviolet (EUV) lithography (EUVL). Representative embodiments provide treatment processes to strengthen whole bulk film quality for improved heat and radiation resistance, as well as to relieve, or otherwise reduce, film stress for improved film stack assembly.

In accordance with some embodiments, a workpiece may comprise a device wafer that includes active devices (e.g., transistors, diodes, and/or the like), and optional passive devices (e.g., capacitors, inductors, resistors, and/or the like). In some embodiments, the transistors may comprise fin field-effect transistors (FinFETs). The transistors may also comprise gate-all-around (GAA) structures. Methods of fabricating transistors, FinFETs, and GAA structures are well known in the art, and will therefore not be discussed here at length in the interest of concision and clarity of description.

Figure 1:
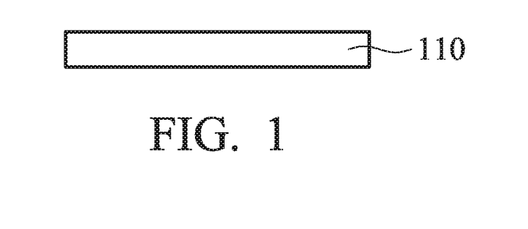
FIGS. 1-3 representatively illustrate manufacturing stages for a region of a semiconductor wafer, in accordance with an embodiment.

FIG. 1 representatively illustrates a region of a workpiece (e.g., a semiconductor wafer) in accordance with some embodiments. The workpiece may include a semiconductor substrate 110 and features formed over a surface of semiconductor substrate 110. In representative embodiments, the substrate may comprise a silicon substrate. In other embodiments, the substrate may comprise one or more other suitable elemental semiconductors (e.g., diamond or germanium), a suitable compound semiconductor (e.g., gallium arsenide, silicon carbide, indium arsenide, or indium phosphide), or a suitable alloy semiconductor (e.g., silicon germanium carbide, gallium arsenic phosphide, or gallium indium phosphide). Substrate 110 may further comprise other features, such as various doped regions, a buried layer, an epitaxy layer, and/or insulating regions (not illustrated). Substrate 110 may be a silicon on insulator (SOI) or silicon on sapphire. In some embodiments, substrate 110 may comprise a doped epitaxial layer, a gradient semiconductor layer, and/or may further include a semiconductor layer overlying another semiconductor layer of a different type, such as a silicon layer on a silicon germanium layer. In other examples, a compound semiconductor substrate may comprise a multilayer silicon structure, or a silicon substrate may include a multilayer compound semiconductor structure.

Shallow trench isolation (STI) regions (not illustrated) may be formed in semiconductor substrate 110 to isolate active regions (e.g., transistors) in semiconductor substrate 110. Through-vias (not illustrated) may be formed to extend into semiconductor substrate 110 to electrically couple device features on opposing sides of the workpiece.

Figure 2:
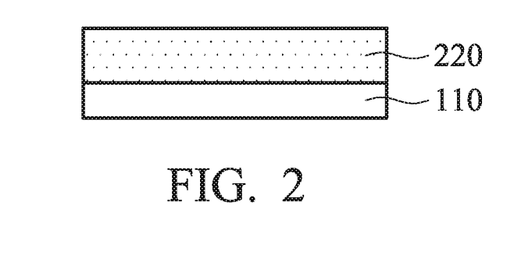

As representatively illustrated in FIG. 2, dielectric layer 220 may be formed over substrate 110. In an embodiment, dielectric layer 220 may be used as a contact etch stop layer (CESL). Dielectric layer 220 may comprise an oxide, a nitride, a silicon-carbon based material, a carbon-doped oxide, and/or combinations thereof. For example, dielectric layer 220 may comprise one or more of SiOC, SiN, SiON, SiOCN, SiO, or the like. Fabrication methods to form dielectric layer 220 may include plasma enhanced chemical vapor deposition (PECVD), or other methods such as high-density plasma CVD (HDPCVD), atomic layer CVD (ALCVD), and/or the like. Dielectric layer 220 may be a single layer or may include more than one layer.

Figure 3:
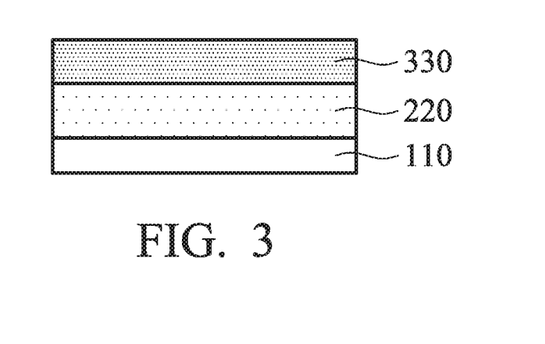

In an embodiment as representatively illustrated in FIG. 3, another dielectric layer 330 may be formed over dielectric layer 220. In accordance with some embodiments, dielectric layer 330 may be formed of a low-k dielectric material. Dielectric layer 330 may be formed using one or more materials selected from the same or substantially similar materials forming dielectric layer 220. When selected from similar materials, the materials of dielectric layer 220 and dielectric layer 330 may be the same as or different from each other. Dielectric layer 330 may be formed using one or more processes selected from the same or substantially similar processes forming dielectric layer 220. When selected from similar processes, the processes forming dielectric layer 220 and dielectric layer 330 may be the same as or different from each other.

In a representative embodiment, dielectric layer 330 may be formed of a low-k dielectric material having a dielectric constant (k-value) lower than about 3.0, lower than about 2.5, or lower than about 1.9. Low-k dielectric layer 330 may be formed of Black Diamond® (a registered trademark of Applied Materials, Santa Clara, Calif., USA), a carbon-containing low-k dielectric material, hydrogen silsesquioxane (HSQ), methylsilsesquioxane (MSQ), or the like. In some embodiments, formation of dielectric layer 330 may include deposition of a porogen-containing dielectric material followed by a curing process to drive out porogen, thereby forming a layer of porous dielectric material. In accordance with some embodiments, dielectric layer 220 may not be present, and therefore not interposed between substrate 110 and dielectric layer 330.

A plurality of material layers may be deposited over dielectric layer 330 prior to photolithographic processing. In a representative aspect, EUV exposure attendant to patterning dielectric layer 330 may comprise extreme ultraviolet light having a wavelength of about 13.5 nm. Use of extreme ultraviolet light (e.g., in the above-described processing context) has the capability of penetrating up to 31 device bi-layers or more, as comparison to immersion UV (e.g., employing wavelengths of 193 nm or 199 nm) generally penetrating up to about 3 device bi-layers. The decreased wavelength associated with EUV corresponds to an increased magnitude and depth of energy deposition. With increasing energy, it has been observed that relatively deeply-disposed layers may experience damage or changes to their material properties upon exposure to extreme ultraviolet light. In the case of either dielectric layer 220 or dielectric layer 330, EUV exposure may cause a layer thickness shrinkage of about 27%. In accordance with representative embodiments disclosed herein, thermal treatment processes are provided to prevent or otherwise reduce material property changes attendant to EUVL pattern imaging.

Figure 4:
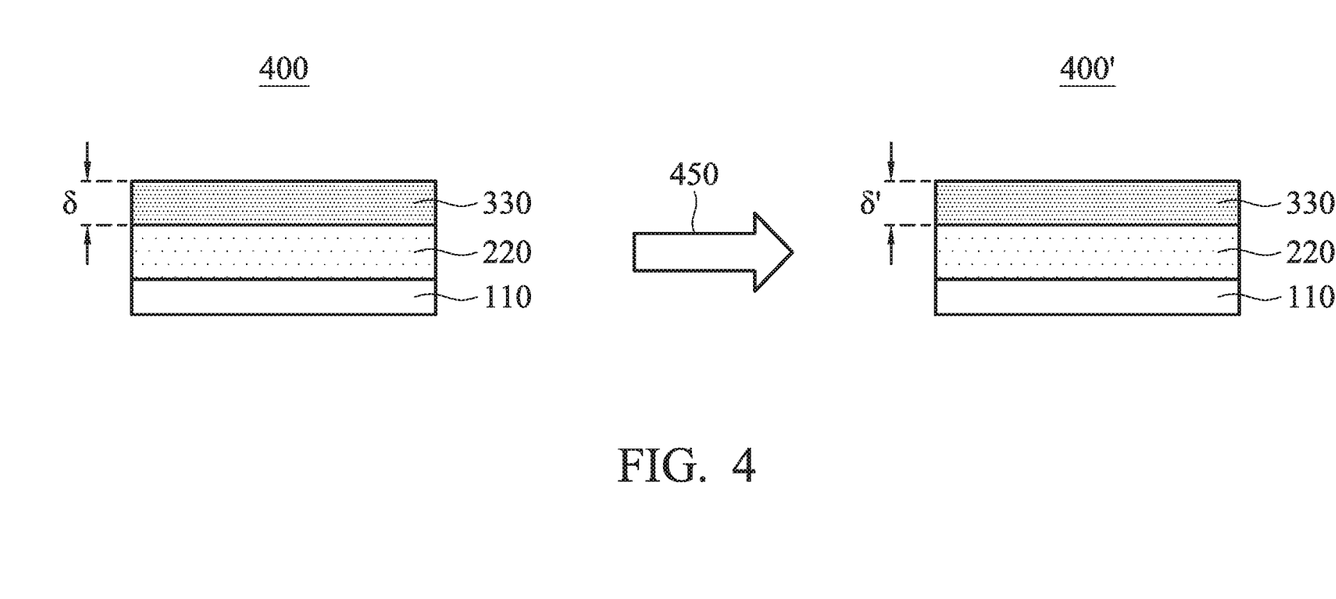
FIG. 4 representatively illustrates thermal treatment of a dielectric layer before extreme ultraviolet (EUV) exposure attendant to extreme ultraviolet lithography (EUVL) processing, in accordance with an embodiment.

As representatively illustrated in FIG. 4, dielectric layer 330 has an as-deposited thickness δ. Wafer region 400 is subjected to thermal treatment 450 to produce thermally treated wafer region 400'. After thermal treatment 450, thermally treated wafer region 400' comprises thermally treated dielectric layer 330' having a post-treatment thickness δ'. Thermally treated wafer region 400' may thereafter be exposed to EUV radiation attendant to EUVL patterning, where EUV exposure of thermally treated dielectric layer 330' may induce a layer thickness change attendant to EUV exposure. In accordance with representative embodiments δ' is less than δ, and a post-EUV-exposure thickness of thermally treated dielectric layer 330' may be less than δ'. Same or similar thickness shrinkage considerations may apply for dielectric layer 220.

In a representative embodiment, the as-deposited thickness δ may be about 19.24 nm, the post-treatment thickness δ' may be about 18.91 nm, and the post-EUV-exposure thickness may be about 17.45 nm. In another embodiment, the as-deposited thickness δ may be about 19.3 nm, the post-treatment thickness δ' may be about 19.0 nm, and the post-EUV-exposure thickness may be about 18 nm. In still other embodiments, a ratio of the post-treatment thickness δ' to the as-deposited thickness δ may be about 0.98 (e.g., the post-treatment thickness δ' being about 98% the value of the as-deposited thickness δ), and a ratio of the post-EUV-exposure thickness to the post-treatment thickness δ' may be about 0.95 (e.g., the post-EUV-exposure thickness being about 95% the value of the post-treatment thickness δ'). In yet other embodiments, a ratio of the post-EUV-exposure thickness to the as-deposited thickness δ may be about 0.90 (e.g., the post-EUV-exposure thickness being about 90% the value of the as-deposited thickness δ).

In accordance with a representative embodiment, thermal treatment 450 may comprise heating wafer region 400 to a temperature of up to about 400° C. For example, wafer region 400 may be heated to a temperature of about 250° C. for a duration of time between about 30 minutes and about 40 minutes. Alternatively or sequentially, wafer region 400 may be heated to a temperature of about 400° C. for a duration of time between about 10 minutes and about 15 minutes. Other temperatures and durations may be alternatively or sequentially employed. In various representative embodiments, thermal treatment 450 may comprise one or more baking or annealing processes or stages. In accordance with other representative embodiments, thermal treatment 450 may comprise one or more ultraviolet (UV) radiation treatments (e.g., with wavelengths longer than EUV wavelengths), ion implantations, ion bombardments, plasma treatments, surface baking treatments, surface coating treatments, surface ashing treatments, pulsed laser treatments, or combinations thereof. In other representative embodiments, one or more material layers to be thermally treated prior to EUVL patterning may be thermally treated at any stage of device fabrication.

Thermal treatment 450 may comprise exposing wafer region 400 to ultraviolet light comprising one or more wavelengths between about 200 nm and about 400 nm. For example, wafer region 400 may be exposed to UV light comprising one or more wavelengths between about 200 nm and about 400 nm for a duration of time of about 2 minutes. In accordance with a representative embodiment, a commercially available UV bulb, such as a fusion-type UV bulb (e.g., available from Haraeus Noblelight America, LLC, Plainview, N.Y., USA) may be used to perform thermal treatment 450. Other wavelengths and durations may be alternatively or sequentially employed. In various representative embodiments, thermal treatment 450 may comprise one or more UV exposure stages or processes. In other representative embodiments, one or more material layers to be thermally treated prior to EUV exposure may be thermally treated at any phase of semiconductor device fabrication.

Figure 5:
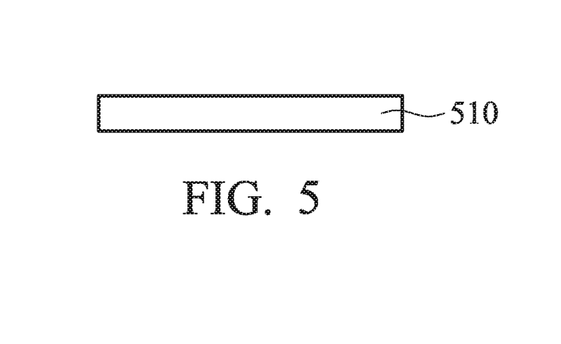
FIGS. 5-8 representatively illustrate manufacturing stages for a region of a semiconductor wafer, in accordance with another embodiment.

As representatively illustrated in FIG. 5, a region of a workpiece may include a semiconductor substrate 510 and features formed over a surface of semiconductor substrate 510. In representative embodiments, substrate 510 may have a same or similar composition as substrate 110. Shallow trench isolation (STI) regions (not illustrated) may be formed in substrate 510 to isolate active regions (e.g., transistors) in substrate 510. Through-vias (not illustrated) may be formed to extend into substrate 510 and electrically couple device features on opposing sides of the workpiece.

Figure 6:
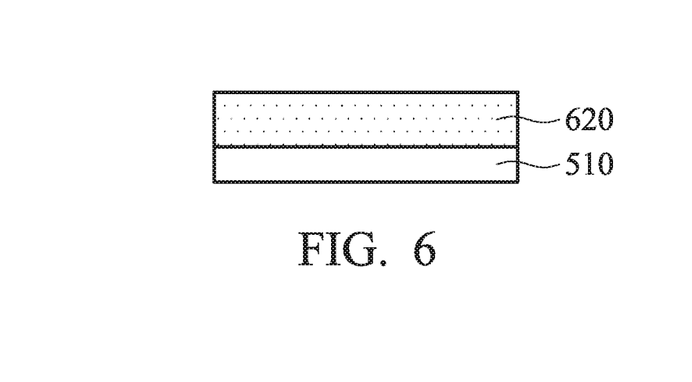

As representatively illustrated in FIG. 6, dielectric layer 620 may be formed over substrate 510. Dielectric layer 620 may have a same or similar composition as dielectric layer 220. Dielectric layer 620 may be formed by a same or similar process as dielectric layer 220. Dielectric layer 620 may be a single layer or may include more than one layer.

Figure 7:
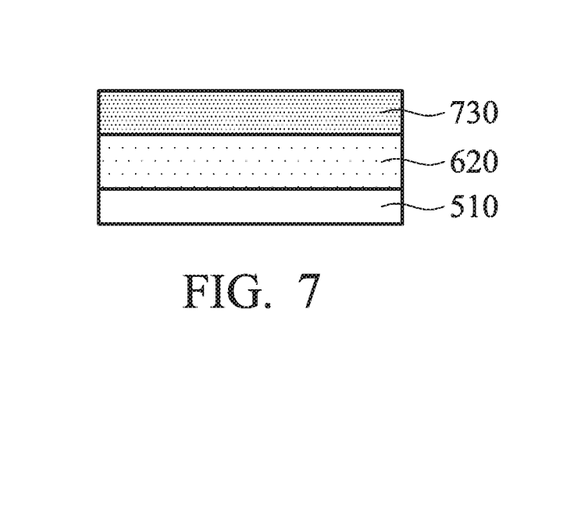

As representatively illustrated in FIG. 7, dielectric layer 730 may be formed over dielectric layer 620. Dielectric layer 730 may be formed of a same or similar composition as dielectric layer 330, and dielectric layer 730 may be formed by a same or similar process as dielectric layer 330.

Figure 8:
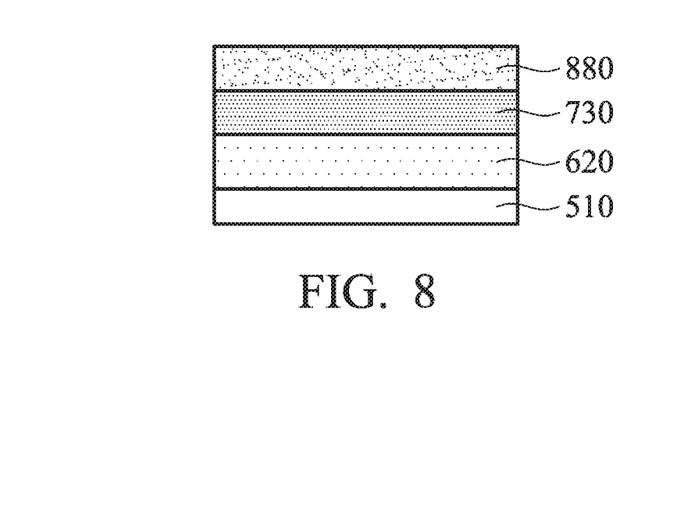

As representatively illustrated in FIG. 8, material layer 880 may be deposited over dielectric layer 730 prior to EUV photolithographic processing. In accordance with various representative aspects, material layer 880 may comprise one or more layers comprising one or more material compositions known in the art of semiconductor device manufacture.

Figure 9:
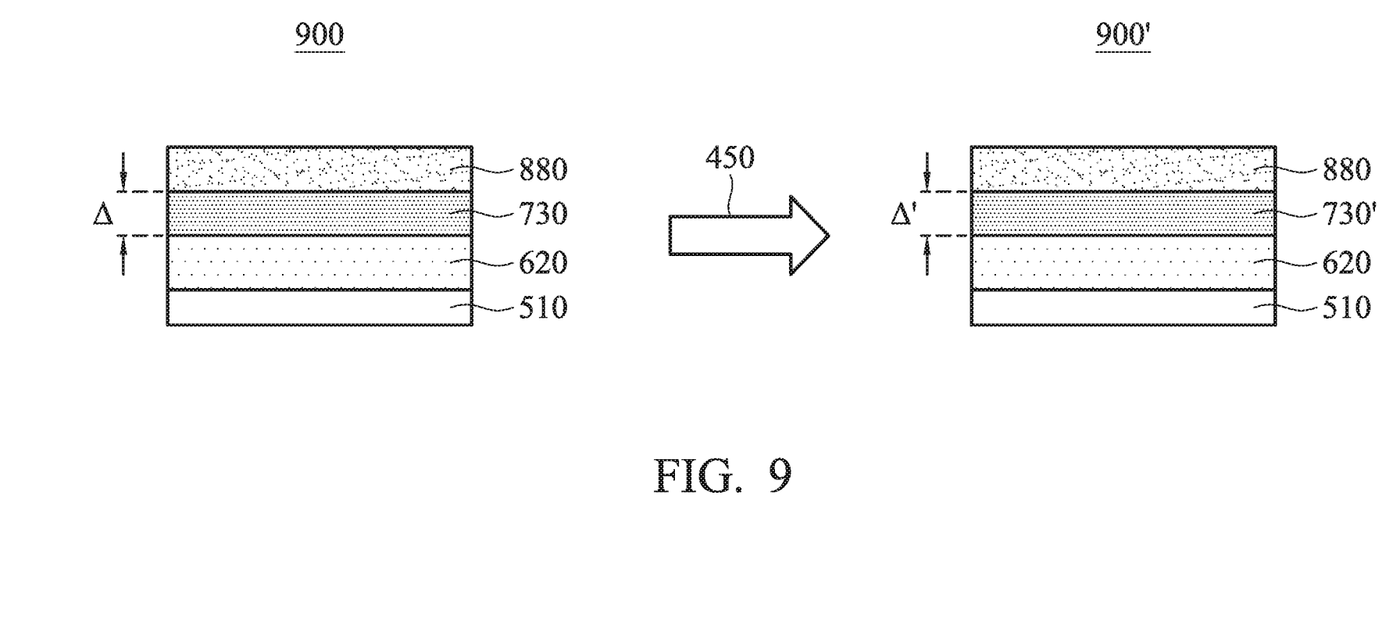
FIG. 9 representatively illustrates thermal treatment of a dielectric layer before EUV exposure attendant to EUVL processing, in accordance with another embodiment.

As representatively illustrated in FIG. 9, dielectric layer 730 has an as-deposited thickness Δ. Wafer region 900 is subjected to thermal treatment 450 to produce thermally treated wafer region 900'. After thermal treatment 450, thermally treated wafer region 900' comprises thermally treated dielectric layer 730' having a post-treatment thickness Δ'. Thermally treated wafer region 900' may thereafter be exposed to EUV radiation attendant to EUVL photolithographic patterning, where EUV exposure of thermally treated dielectric layer 730' may induce a layer thickness change attendant to EUV exposure. In accordance with representative embodiments, Δ' may be less than Δ, and a post-EUV-exposure thickness of thermally treated dielectric layer 730' may be less than Δ'. Same or similar thickness shrinkage considerations may apply to dielectric layer 620 and/or material layer 880.

In a representative embodiment, the as-deposited thickness Δ may be about 19.24 nm, the post-treatment thickness Δ' may be about 18.91 nm, and the post-EUV-exposure thickness may be about 17.45 nm. In another embodiment, the as-deposited thickness Δ may be about 19.3 nm, the post-treatment thickness Δ' may be about 19.0 nm, and the post-EUV-exposure thickness may be about 18 nm. In still other embodiments, a ratio of the post-treatment thickness Δ' to the as-deposited thickness Δ may be about 0.98 (e.g., the post-treatment thickness Δ' being about 98% the value of the as-deposited thickness Δ), and a ratio of the post-EUV-exposure thickness to the post-treatment thickness Δ' may be about 0.95 (e.g., the post-EUV-exposure thickness being about 95% the value of the post-treatment thickness Δ'). In yet other embodiments, a ratio of the post-EUV-exposure thickness to the as-deposited thickness Δ may be about 0.90 (e.g., the post-EUV-exposure thickness being about 90% the value of the as-deposited thickness Δ).

In accordance with some embodiments, a tri-layer may be formed over dielectric layer 330 or dielectric layer 730. The tri-layer may include a bottom layer, a middle layer, and an upper layer. The middle layer may be disposed over the bottom layer, and the upper layer may be disposed over the middle layer. In some embodiments, the bottom layer and upper layer may be formed of one or more photoresist materials. The middle layer may be formed of a silicon-containing material, which may be a nitride (e.g., SiN), an oxynitride (e.g., SiON), an oxide (e.g., SiO), a carbide (e.g., SiOC), or the like. The middle layer generally has a relatively high etch selectivity as compared to the upper layer and the bottom layer. Accordingly, the upper layer may be used as an etching mask for patterning the middle layer. Similarly, the middle layer may be used as an etching mask for patterning the bottom layer. In alternative embodiments, an optional antireflective layer (ARL) or nitrogen-free ARL (NFARL) may be deposited over dielectric layer 330 or dielectric layer 730 with, e.g., PECVD.

Thermal treatment 450 may comprise plural stages. Where thermal treatment 450 comprises more than one stage, various sequencing permutations among and between thermal treatment stages are possible (e.g., alternation or interleaving of heat treatment stages and UV treatment stages). In accordance with some embodiments, a material layer may be thermally treated to densify its structure prior to deposition of one or more layers on or overlying the material layer to be thermally treated. In other embodiments, a material layer may be thermally treated to densify its structure after deposition of one or more other layers on or overlying the material layer to be thermally treated.

Figure 10:
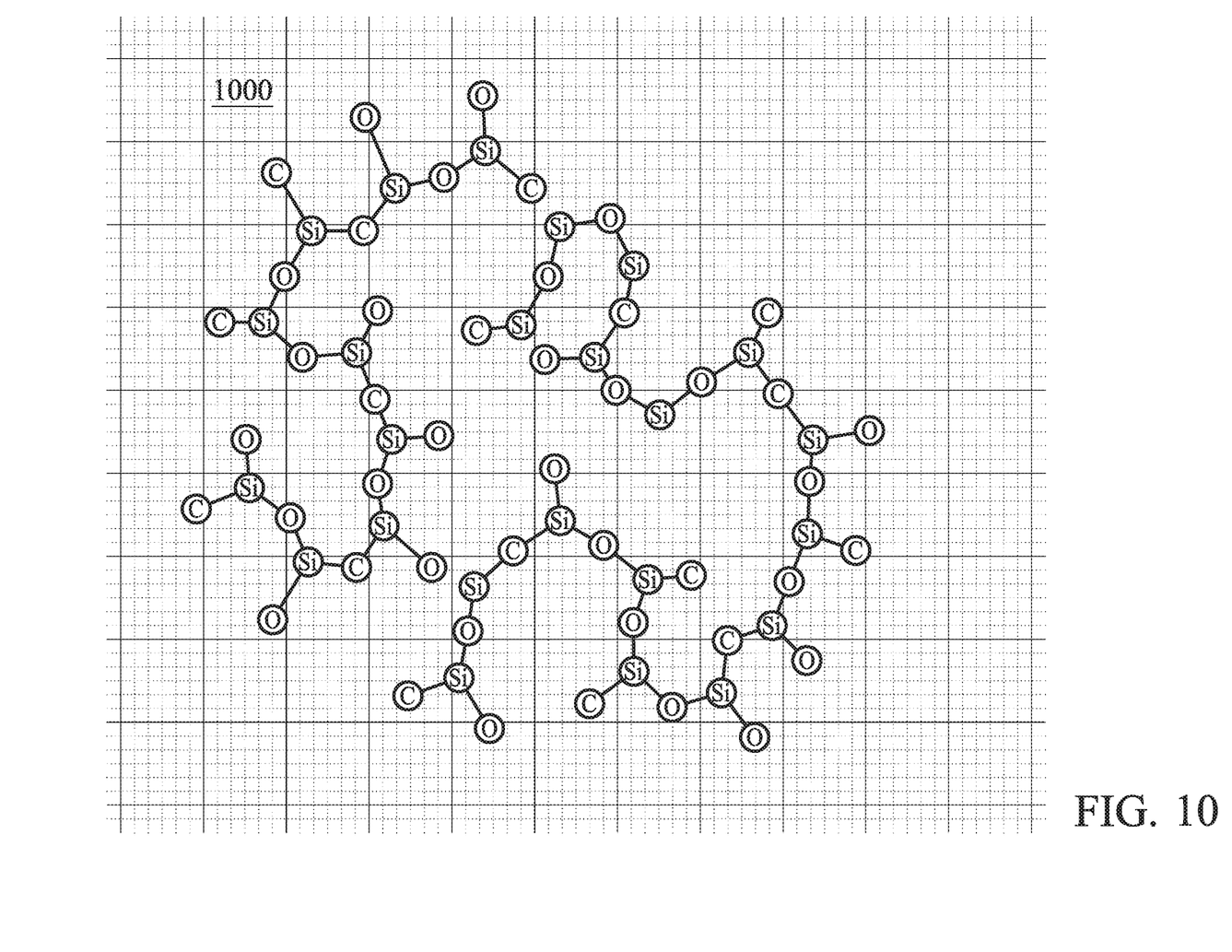
FIG. 10 representatively illustrates a sparsely-(or less-densely-) packed region of SiOC material prior to thermal treatment in accordance with an embodiment.

FIG. 10 illustrates a sparsely-packed (or less-densely-packed) arrangement of SiOC material 1000, in accordance with a representative embodiment. For example, some regions (or portions) of SiOC material 1000 may be spatially separated from other regions (or portions) of SiOC material 1000. Additionally, there may be a relatively low population of closed ring structures (not illustrated in FIG. 10). As representatively illustrated, FIG. 10 omits depiction of hydrogen atoms and bonds to hydrogen atoms, in accordance with standard practice in the art.

Figure 11:
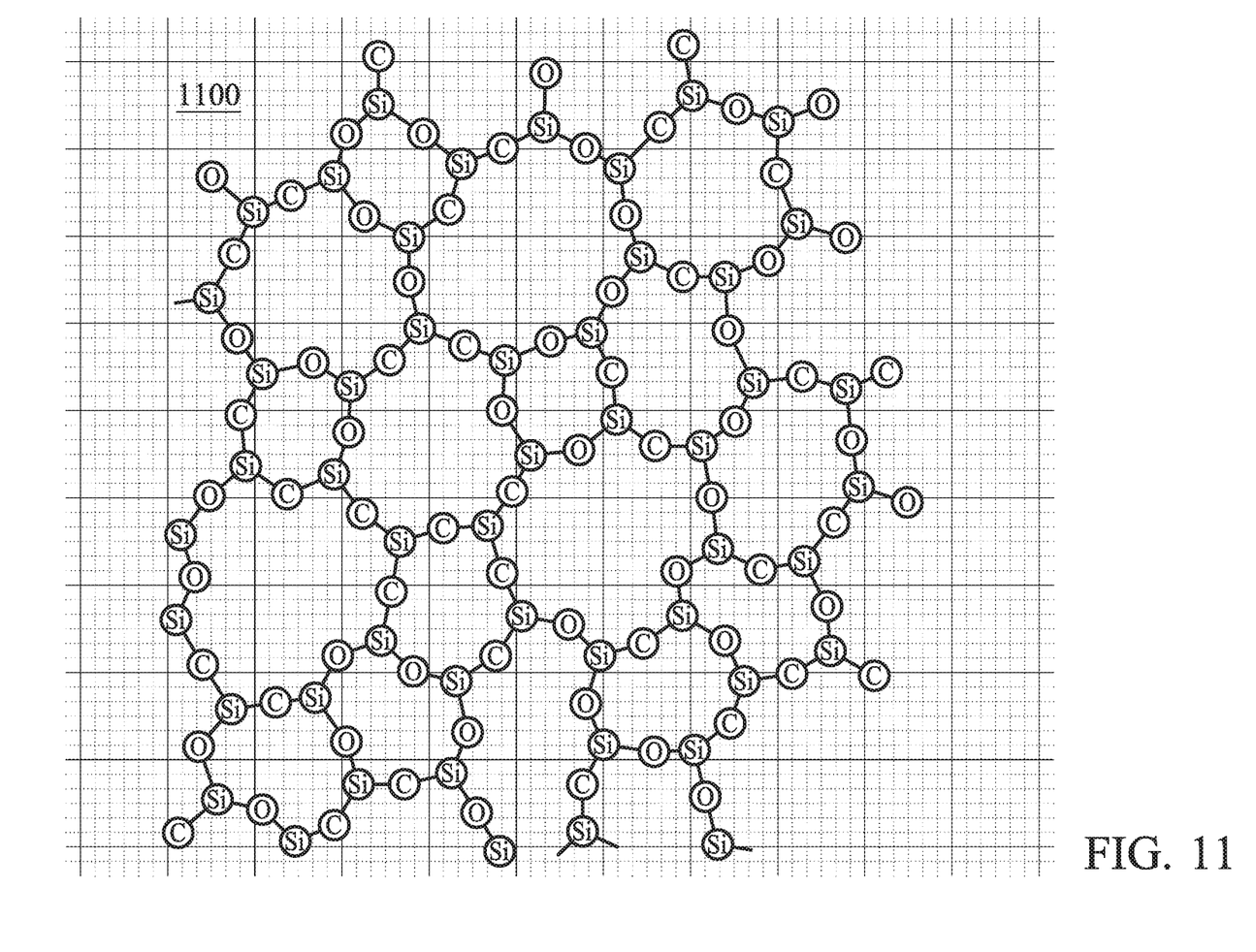
FIG. 11 representatively illustrates a more-densely-packed region of SiOC material after thermal treatment, in accordance with an embodiment.

FIG. 11 illustrates formation of more-densely-packed SiOC material 1100 after application of one or more thermal treatments 450 applied to sparsely-packed SiOC material 1000, in accordance with representative embodiments. As thermal treatment(s) 450 is/are applied to sparsely-packed SiOC material 1000, a more compact Si—O—Si structure is formed resulting from a densified (or more-densely-packed) bonding structure of SiOC material 1100. More-densely-packed SiOC material 1100 will generally exhibit a stronger Si—O—Si bond network with fewer dangling bonds, as compared to sparsely-packed SiOC material 1000. Application of thermal treatment processes (e.g., among and between plural SiOC material portions) may extend densification of the three-dimensional Si—O—Si bond network, thereby reducing the population of dangling bonds otherwise appearing in the structure of sparsely-packed SiOC material 1000. Additionally, there may be a relatively higher population of closed ring structures in more-densely-packed SiOC material 1100 as compared to sparsely-packed SiOC material 1000. As representatively illustrated, FIG. 11 also omits depiction of hydrogen atoms and bonds to hydrogen atoms, in accordance with standard practice in the art.

Reduction of dangling bonds generally contributes to better material layer and bulk film quality. Better material layer and bulk film quality generally provides improved resistance to heat-induced and radiation-induced changes in layer/film quality during subsequent EUV photolithographic processing. Persons skilled in the art will appreciate that while FIG. 10 and FIG. 11 representatively illustrate densification of SiOC material, various other materials may be similarly processed to reduce the occurrence of dangling bonds or otherwise improve material layer and/or bulk film quality. For example, SiOCN, SiN, SiON, SiO, and/or the like, may be similarly thermally treated 450 to similarly densify their respective bond network structures.

Figure 12:
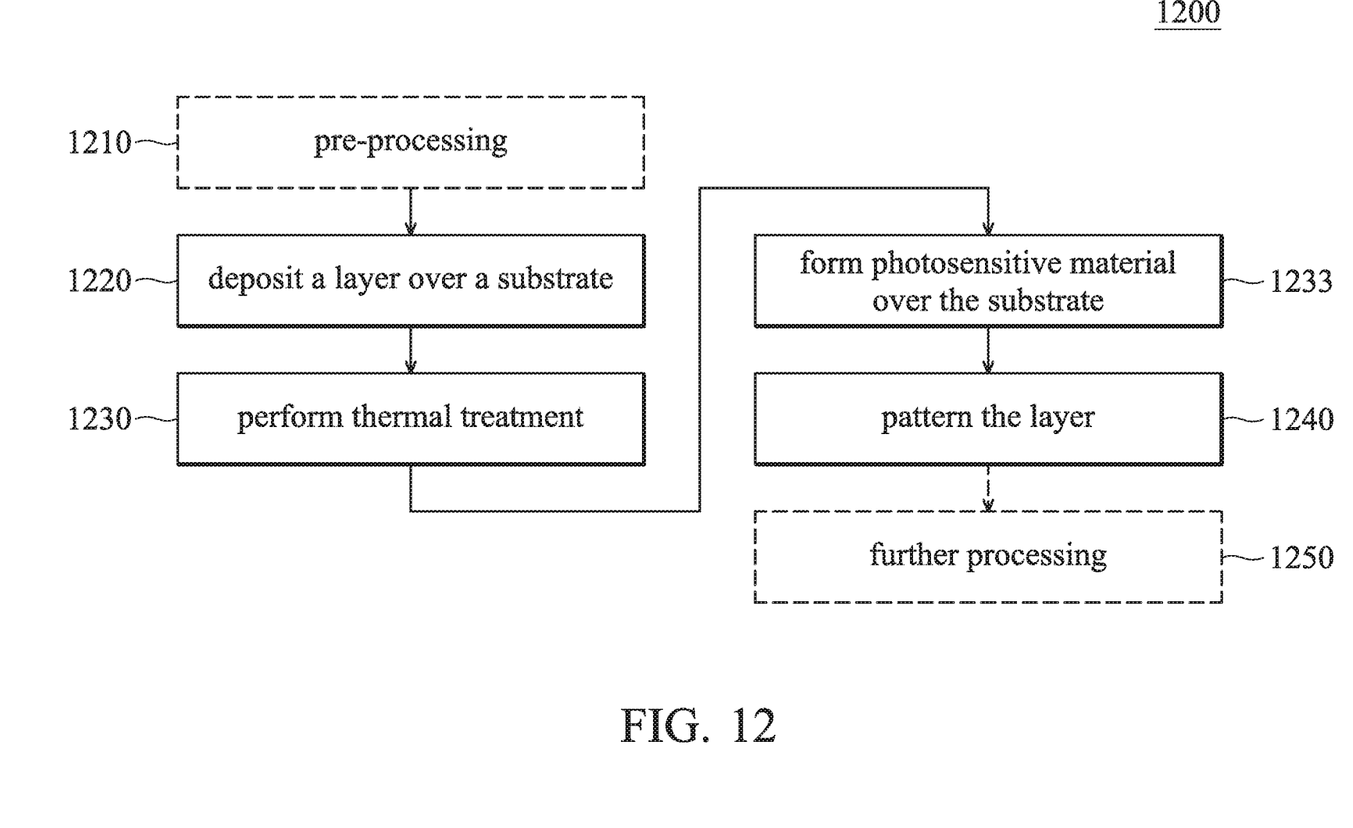
FIG. 12 is a process flow diagram representatively illustrating a method for preventing or otherwise reducing lithography-induced material property changes to a material layer, in accordance with an embodiment.

FIG. 12 representatively illustrates a method for preventing, or otherwise reducing, electromagnetic radiation-induced property changes to a material layer (e.g., dielectric layer 330, dielectric layer 220, dielectric layer 730, dielectric layer 620) attendant to photolithographic patterning, in accordance with an embodiment. The method optionally begins with pre-processing step 1210. Pre-processing step 1210 may include various optional steps known in the art semiconductor manufacture for processing substrate 110, including, e.g., the deposition of one or more materials (e.g., dielectric material 220) over substrate 110, 510 prior to step 1220. In step 1220, a material layer (e.g., dielectric layer 330) is deposited over substrate 110, 510. In step 1230, the material layer is thermally treated 450 (e.g., to at least partially densify or otherwise stabilize a composition of matter comprising the material layer). In step 1233, a photosensitive material (e.g., photoresist, a tri-layer structure, or the like) is formed over the material layer. In step 1240, the material layer is exposed to electromagnetic radiation (e.g., attendant to EUVL processing) to pattern the material layer. In step 1250, the wafer may be optionally further processed. For example, optional post-processing step 1250 may include various process steps known in the art for manufacturing a finished semiconductor device.

Figure 13:
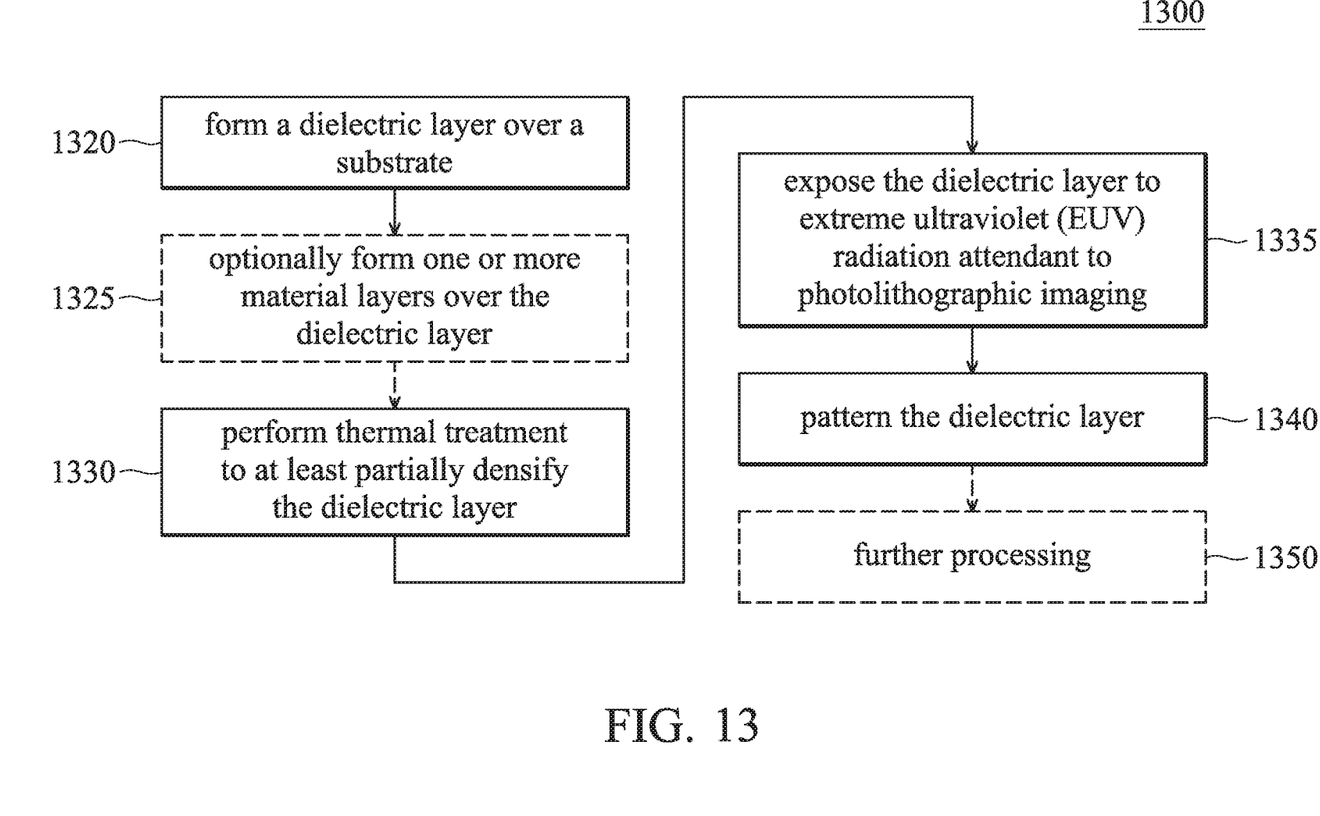
FIG. 13 is a process flow diagram representatively illustrating a method for preventing, or otherwise reducing, EUVL-induced material property changes to a dielectric layer, in accordance with an embodiment.

FIG. 13 representatively illustrates a method for preventing or otherwise reducing EUV-induced material property changes to a dielectric layer, in accordance with an embodiment. The method begins with a step 1320 of forming a dielectric layer (e.g., SiOC) over a substrate (e.g., semiconductor substrate 110, semiconductor substrate 510, or the like). In step 1325, one or more material layers are formed over the dielectric layer (e.g., a layer of photoresist, a tri-layer photoresist, or the like). In step 1330, the dielectric layer is thermally treated 450 to produce an at least partially densified bond network structure in material forming the dielectric layer. In step 1335, the dielectric layer is exposed to EUV radiation (e.g., attendant to EUVL imaging). In step 1340, the dielectric layer is patterned (e.g., with wet etching, dry etching, ablation, and/or the like). In optional step 1350, the dielectric layer may be further processed (e.g., for fabrication of a finished semiconductor device).

Figure 14:
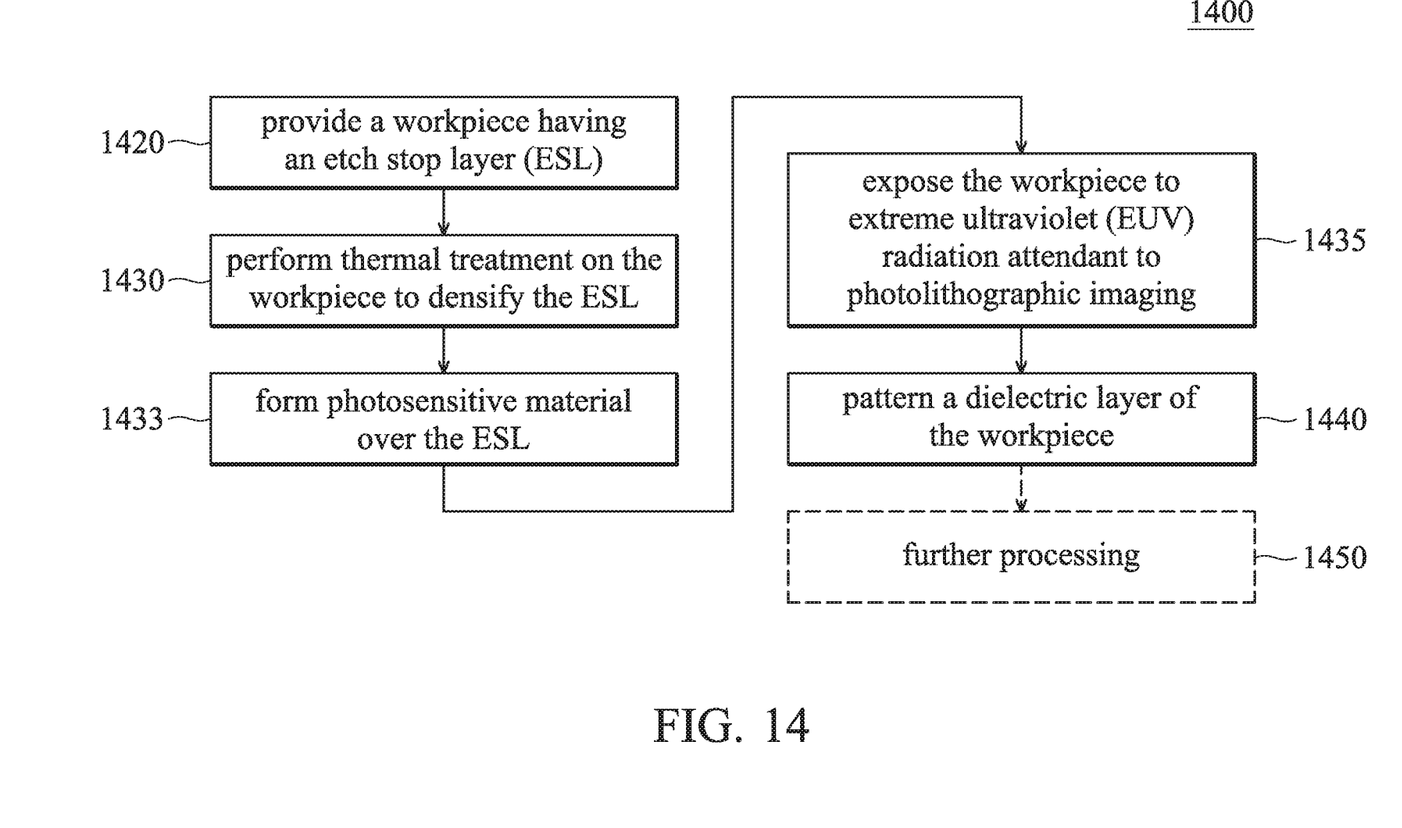
FIG. 14 is a process flow diagram representatively illustrating a method for preventing, or otherwise reducing, EUVL-induced thickness shrinkage of a dielectric layer, in accordance with an embodiment.

FIG. 14 representatively illustrates a method for preventing or otherwise reducing EUV-induced thickness shrinkage of a dielectric layer (e.g., 220, 330, 620, 730), in accordance with an embodiment. The method begins with a step 1420 of providing a workpiece comprising an etch stop layer (ESL). In step 1430, the ESL (e.g., dielectric layer 220, dielectric layer 620, or the like) is thermally treated 450 to densify the bond network structure of material forming the ESL. In step 1433, a photosensitive material (e.g., photoresist, a tri-layer photoresist, or the like) is formed over the ESL. In accordance with representative aspects, one or more material layers may optionally interpose the ESL and the photosensitive material. In step 1435, the workpiece (including the ESL) is exposed to EUV radiation (e.g., attendant to EUVL imaging). In step 1440, a dielectric layer (e.g., 220, 330, 620, 730) of the workpiece is patterned (e.g., with wet etching, dry etching, ablation, and/or the like). In optional step 1450, the workpiece may be further processed (e.g., attendant to fabrication of a finished device die).

Densifying thermal treatments 450 may be applied to any type of material composition, film, or layer used in any semiconductor fabrication process. Representative processes include a front-end-of-line (FEOL) process, a back-end-of-line (BEOL) process, a mid-end-of-line (MEOL)

process, and/or the like. Representative materials, films, or layers may include a sacrificial layer, a cap layer, a dielectric layer, a low-k dielectric layer, a hard mask layer, an etch stop layer, a contact etch stop layer (CESL), and/or the like. Representative material classifications may include oxides, silicon-containing oxides, nitrides, silicon-containing nitrides, carbides, silicon-containing carbides, and/or the like. Representative material compositions may include SiOC, SiN, SiON, SiOCN, SiO, poly-Si, and/or the like.

In accordance with various aspects, representatively disclosed embodiments may be employed to prevent or otherwise substantially reduce EUV-induced material property changes to one or more material layers where deposition and processing of one or more protective film layers may otherwise be desired, indicated, or suggested, to alternatively provide protection. Consequently, substantial cost savings may be achieved with various embodiments representatively disclosed herein as they may be associated with eliminating or reducing the use of overlying protective layers. Additionally, EUVL may be employed with relative high intensity and deeper energy deposition while reducing film quality changes in thermally treated (450) material layers, in accordance with various embodiments.

In various other aspects, representatively disclosed embodiments may be used to eliminate, relieve, or otherwise reduce internal stress (e.g., compressive stress) in a material layer. In an embodiment employing an SiOC film, the SiOC film may have an internal compressive stress of about −216 MPa as deposited or initially formed. After thermal treatment 450, the SiOC film may have an internal compressive stress of about −42 MPa, corresponding to about a 5.1 fold (i.e., a multiplicative factor of about 5.1) reduction in compressive stress.

In a representative embodiment, a stress film may be added to a device assembly to further reduce stress to about neutral. The stress film may be formed by chemical vapor deposition (CVD), physical vapor deposition (PVD), atomic layer deposition (ALD), high density plasma CVD (HDP-CVD), plating, other suitable methods, and/or combinations thereof. The stress film may include a dielectric material. In some embodiments, the stress film may comprise silicon nitride, silicon oxynitride, SiCN, and/or combinations thereof. In other embodiments, the stress film may include an oxide or a silicon-containing oxide. In some embodiments, the stress film may have a thickness greater than the thickness of a layer adjoining the stress film. In some embodiments, the stress film may have a thickness ranging from about 100 Å to about 300 Å. In other embodiments, the stress film may provide reduction of compressive stress in a subsequent annealing process applied to the stress film.

In a representative embodiment, a method comprises steps of: depositing a layer over a substrate; performing a thermal treatment to at least partially densify material of the layer; after performing the thermal treatment, forming a photosensitive material over the substrate; and patterning the layer. The layer may comprise a dielectric material. The dielectric material may comprise a contact etch stop layer (CESL). The step of performing the thermal treatment may comprise at least one of: heating the layer to a first temperature of up to about 400° C.; heating the layer to a second temperature of about 250° C. for a first duration of time between about 30 minutes and about 40 minutes; and/or heating the layer to a third temperature of about 400° C. for a second duration of time between about 10 minutes and about 15 minutes. The step of performing the thermal treatment may comprise at least one of an annealing treatment, an ultraviolet (UV) radiation treatment, an ion implantation, an ion bombardment, a plasma treatment, a surface baking treatment, a surface coating treatment, a surface ashing treatment, and/or a pulsed laser treatment. The step of patterning the layer may comprise exposing the layer to extreme ultraviolet (EUV) radiation having a wavelength of about 13.5 nm. The layer may have a first thickness prior to performing the thermal treatment, a second thickness after performing the thermal treatment, and a third thickness after exposing the layer to EUV radiation. The second thickness may be less than the first thickness, and the third thickness may be less than the second thickness. A first ratio of the second thickness to the first thickness may be about 0.98:1. A second ratio of the third thickness to the second thickness may be about 0.95:1. The layer may have a first average compressive stress prior to performing the thermal treatment, and a second average compressive stress after performing the thermal treatment and after exposing the layer to extreme ultraviolet (EUV) radiation. The second average compressive stress may be less than the first average compressive stress. A ratio of the first average compressive stress to the second average compressive stress may be about 5:1.

In another representative embodiment, a method comprises steps of: forming a dielectric layer over a substrate; optionally forming one or more material layers over the dielectric layer; performing a thermal treatment to at least partially stabilize the dielectric layer; and after performing the thermal treatment, exposing the dielectric layer to extreme ultraviolet (EUV) radiation attendant to patterning the dielectric layer. The dielectric layer may comprise a material having a first atomic arrangement prior to thermal treatment and a second atomic arrangement after thermal treatment, where the second atomic arrangement is more stable than the first atomic arrangement. At least one of the optionally formed one or more material layers may comprise a photoresist layer. Exposing the dielectric layer to EUV radiation may comprise using ultraviolet light having a wavelength of about 13.5 nm. The dielectric layer may have a first thickness prior to performing the thermal treatment, a second thickness after performing the thermal treatment, and a third thickness after exposing the dielectric layer to EUV radiation. The second thickness may be less than the first thickness, and the third thickness may be less than the second thickness. The second thickness may be about 98% the value of the first thickness, and the third thickness may be about 95% the value of the second thickness. The dielectric layer may have a first average compressive stress prior to performing the thermal treatment, and a second average compressive stress after performing the thermal treatment and after exposing the dielectric layer to EUV radiation. The second average compressive stress may be less than the first average compressive stress. The first average compressive stress may be about 5.1 times greater than the second average compressive stress. The thermal treatment may comprise at least one of an ultraviolet (UV) radiation treatment, an ion implantation, an ion bombardment, a plasma treatment, a surface baking treatment, a surface coating treatment, a surface ashing treatment, or a pulsed laser treatment.

In yet another representative embodiment, a system comprises a workpiece having a photoresist layer, a dielectric layer, and a substrate. The dielectric layer is over the substrate, and the photoresist layer is over the dielectric layer. The system further comprises a heat source heating the workpiece for a first duration of time, and an extreme ultraviolet (EUV) radiation source impinging on the workpiece for a second duration of time. The dielectric layer has a first thickness prior to heating, a second thickness after heating, and a third thickness after impingement of EUV radiation. The second thickness is about 98% the value of the first thickness. The third thickness is about 95% the value of the second thickness. The dielectric layer has a first average compressive stress prior to impingement of EUV radiation and a second average compressive stress after impingement of EUV radiation, where the first average compressive stress is about five times greater than the second average compressive stress.

Although representative embodiments and advantages have been described herein, it will be understood that various changes, substitutions, and/or alterations can be made without departing from the spirit and scope of the disclosure as defined by the appended claims. Moreover, the scope of the present description is not intended to be limited to particular embodiments of any specific process, machine, article of manufacture, composition of matter, means, methods, or steps described in the specification. As one of ordinary skill in the art will appreciate from the disclosure, various processes, machines, articles of manufacture, compositions of matter, means, methods, or steps, presently existing or subsequently developed, that perform substantially the same function or achieve a substantially similar result as corresponding embodiments described herein may be utilized according to the present disclosure. Accordingly, the appended claims are intended to include within their scope such processes, machines, articles of manufacture, compositions of matter, means, methods, or steps.

What is claimed is:

1. A method comprising:
   forming a dielectric layer over a substrate, the dielectric layer having a first thickness, the dielectric layer comprising SiOC, SiN, SiON, SiOCN, or any combination thereof;
   after forming the dielectric layer, performing a thermal treatment to at least partially stabilize the dielectric layer, after the performing the thermal treatment the dielectric layer having a second thickness less than the first thickness;
   after performing the thermal treatment, forming a photoresist over the dielectric layer; and
   after forming the photoresist, exposing the dielectric layer to extreme ultraviolet (EUV) radiation attendant to patterning the dielectric layer, after the exposing the dielectric layer to EUV radiation the dielectric layer having a third thickness less than the second thickness.

2. The method of claim 1, wherein the dielectric layer comprises a material having a first atomic arrangement prior to thermal treatment and a second atomic arrangement after thermal treatment, wherein the second atomic arrangement is more stable than the first atomic arrangement.

3. The method of claim 1, wherein exposing the dielectric layer to EUV radiation comprises ultraviolet light having a wavelength of about 13.5 nm.

4. The method of claim 1, wherein the second thickness is about 98% of the first thickness, and the third thickness is about 95% of the second thickness.

5. The method of claim 1, further comprising the dielectric layer having a first average compressive stress prior to performing the thermal treatment, and a second average compressive stress after performing the thermal treatment and after exposing the dielectric layer to EUV radiation, wherein the second average compressive stress is less than the first average compressive stress.

6. The method of claim 5, wherein the first average compressive stress is about 5.1 times greater than the second average compressive stress.

7. The method of claim 1, wherein the thermal treatment comprises at least one of an ultraviolet (UV) radiation treatment, an ion implantation, an ion bombardment, a plasma treatment, a surface baking treatment, a surface coating treatment, a surface ashing treatment, or a pulsed laser treatment.

8. The method of claim 1, further comprising forming one or more material layers over the dielectric layer.

9. A method comprising:
   depositing a dielectric layer over a substrate, the dielectric layer having a first thickness, the dielectric layer comprising SiOC, SiN, SiON, SiOCN, or any combination thereof;
   depositing one or more material layers over the dielectric layer;
   after depositing the one or more material layers, performing a thermal treatment, wherein the dielectric layer has a second thickness less than the first thickness after the thermal treatment, wherein a ratio of the second thickness to the first thickness is about 98%;
   after performing the thermal treatment, forming a photoresist layer over the one or more material layers; and
   after forming the photoresist layer, patterning the dielectric layer and the one or more material layers using extreme ultraviolet (EUV) radiation, wherein the dielectric layer has a third thickness less than the second thickness after the patterning, wherein a ratio of the third thickness to the second thickness is about 95%.

10. The method of claim 9, wherein the dielectric layer comprises a contact etch stop layer (CESL).

11. The method of claim 9, wherein performing the thermal treatment comprises at least one of:
    heating the dielectric layer to a first temperature of about 250° C. for a first duration of time between about 30 minutes and about 40 minutes; or
    heating the dielectric layer to a second temperature of about 400° C. for a second duration of time between about 10 minutes and about 15 minutes.

12. The method of claim 9, wherein performing the thermal treatment comprises at least one of an annealing treatment, an ultraviolet (UV) radiation treatment, an ion implantation, an ion bombardment, a plasma treatment, a surface baking treatment, a surface coating treatment, a surface ashing treatment, or a pulsed laser treatment.

13. The method of claim 9, wherein patterning the dielectric layer comprises exposing the dielectric layer to extreme ultraviolet (EUV) radiation having a wavelength of about 13.5 nm.

14. The method of claim 13, wherein the dielectric layer has a first thickness prior to performing the thermal treatment, a second thickness after performing the thermal treatment, and a third thickness after exposing the dielectric layer to EUV radiation, wherein the second thickness is less than the first thickness, and the third thickness is less than the second thickness.

15. The method of claim 14, wherein a ratio of the third thickness to the first thickness is between about 90% and 93.1%.

16. The method of claim 9, wherein the thermal treatment at least partially densifies and stabilizes a material of the dielectric layer.

17. The method of claim 9, further comprising the dielectric layer having a first average compressive stress prior to performing the thermal treatment, and a second average compressive stress after performing the thermal treatment and after exposing the dielectric layer to extreme ultraviolet (EUV) radiation, wherein the second average compressive stress is less than the first average compressive stress.

18. The method of claim 17, wherein a ratio of the first average compressive stress to the second average compressive stress is about 5:1.

19. A method comprising:
depositing a contact etch stop layer over a substrate, the contact etch stop layer comprising SiOC, SiN, SiON, or SiOCN, the contact etch stop layer having a first thickness and a first internal average compressive stress;
forming a plurality of material layers over the contact etch stop layer;
performing a thermal treatment on the contact etch stop layer, after the thermal treatment the contact etch stop layer having a second thickness and a second internal average compressive stress, the second thickness being about 98% to 98.4% of the first thickness, the second internal average compressive stress being less than the first internal average compressive stress, the thermal treatment comprising:
 first, heating at a temperature of about 250° C. for between about 30 and 40 minutes; and
 second, heating at a temperature of about 400° C. for between about 10 and 15 minutes;
after performing the thermal treatment, depositing a tri-layer photoresist layer over the plurality of material layers, the tri-layer photoresist layer comprising a middle layer, the middle layer comprising silicon; and
after depositing the tri-layer photoresist layer, patterning the contact etch stop layer by exposing the contact etch stop layer to an extreme ultraviolet (EUV) radiation, after the exposing the contact etch stop layer having a third thickness, the third thickness being about 90% to 93.1% of the first thickness.

20. The method of claim 19, wherein a ratio of the first internal average compressive stress to the second internal average compressive stress is about 5:1.

* * * * *